(12) United States Patent
Sugiyama et al.

(10) Patent No.: US 9,720,310 B2
(45) Date of Patent: Aug. 1, 2017

(54) LIGHT SOURCE DEVICE

(71) Applicant: Nichia Corporation, Anan-shi, Tokushima (JP)

(72) Inventors: Takafumi Sugiyama, Yoshinogawa (JP); Shinichi Nagahama, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 238 days.

(21) Appl. No.: 14/719,976

(22) Filed: May 22, 2015

(65) Prior Publication Data

US 2015/0338727 A1 Nov. 26, 2015

(30) Foreign Application Priority Data

May 23, 2014 (JP) ................. 2014-106888

(51) Int. Cl.
| | |
|---|---|
| *G03B 21/14* | (2006.01) |
| *G03B 21/20* | (2006.01) |
| *F21L 14/02* | (2006.01) |
| *H04N 9/31* | (2006.01) |
| *G03B 33/08* | (2006.01) |
| *H01S 5/00* | (2006.01) |
| *H01S 5/40* | (2006.01) |

(52) U.S. Cl.
CPC .......... *G03B 21/204* (2013.01); *F21L 14/023* (2013.01); *G03B 21/206* (2013.01); *G03B 21/2013* (2013.01); *G03B 33/08* (2013.01); *H04N 9/3158* (2013.01); *H04N 9/3164* (2013.01); *H01S 5/0078* (2013.01); *H01S 5/4093* (2013.01)

(58) Field of Classification Search
CPC .............. G03B 21/204; G03B 21/2033; G03B 21/2013; F21K 9/56; F21L 14/023; F21Y 2113/002; F21Y 2113/005
USPC ............................................ 362/34, 84, 231
See application file for complete search history.

(56) References Cited

U.S. PATENT DOCUMENTS

| | | | |
|---|---|---|---|
| 6,409,349 B1 * | 6/2002 | O'Connor .......... | G03B 21/2026 348/E9.027 |
| 6,988,806 B2 * | 1/2006 | Slobodin ................ | H04N 9/315 348/E9.027 |
| 2014/0211169 A1 | 7/2014 | Kitano et al. | |
| 2015/0167932 A1* | 6/2015 | Yamada ............... | G02B 27/102 362/19 |

(Continued)

FOREIGN PATENT DOCUMENTS

| | | |
|---|---|---|
| JP | 2013-041170 A | 2/2013 |
| JP | 05-418839 B2 | 2/2014 |
| JP | 2014-160227 A | 9/2014 |

*Primary Examiner* — William C Dowling
(74) *Attorney, Agent, or Firm* — Foley & Lardner LLP (57) ABSTRACT

Provided is a high-emission light source device which is capable of obtaining a desired color tone of red light and can be mounted on a small projector.
A light source device includes a first light source for emitting a red light, a second light source for emitting a light different from the red light, a fluorescent member for emitting a light containing a red light component and a light component other than the red light component upon receiving the light emitted from the second light source, and a filter for transmitting or reflecting the red light component of the light emitted from the fluorescent member.

19 Claims, 9 Drawing Sheets

(56) References Cited

U.S. PATENT DOCUMENTS

| | | | | |
|---|---|---|---|---|
| 2015/0316775 A1* | 11/2015 | Hsieh | ............... | G03B 21/2013 353/31 |
| 2016/0054574 A1* | 2/2016 | Huang | ............... | H04N 13/0431 349/33 |
| 2016/0064148 A1* | 3/2016 | Ishii | ............... | H05K 1/162 361/782 |

* cited by examiner

Fig. 1

Fig. 2A (1) Filter 10 is arranged at side opposite to side where light from second light source 6 enters.
(2) Phosphor 8 and filter 10 are arranged abut to each other (may also arranged spaced apart from each other).
(3) Filter 10 transmits red light component.

Fig. 2B (1) Filter 10 is arranged at side opposite to side where light from second light source 6 enters.
(2) Phosphor 8 and filter 10 are arranged spaced apart from each other.
(3) Filter 10 reflects red light component.

Fig. 2C (1) Filter 10 is arranged at side where light from second light source 6 enters.
(2) Phosphor 8 and filter 10 are abut to each other (may also arranged spaced apart from each other).
(3) Filter 10 transmits red light component.

Fig. 2D (1) Filter 10 is arranged at side where light from second light source 6 enters.
(2) Phosphor 8 and filter 10 are arranged spaced apart from each other.
(3) Filter 10 reflects red light component.

Fig. 3

Fig. 4A (a) Region for obtaining red light

Fig. 4B

(b) Region for obtaining blue light

LIGHT SOURCE DEVICE

CROSS-REFERENCE TO RELATED APPLICATIONS

The present application claims priority of Japanese Patent Application No. 2014-106,888, filed on May 23, 2014, the entire specification, claims and drawings of which are incorporated herewith by reference.

BACKGROUND

Technical Field

The present disclosure relates to a light source device, and particularly, to a light source device that can be used in a projector.

Description of Related Art

As a light source device used in a projector, there has been disclosed a light source device which is provided with a light emitting element configured to emit a red light, an excitation light source configured to emit a blue light, and a phosphor which wavelength-converts blue light to green light (e.g., JP 2013-41170 A).

SUMMARY

In a light source device described in JP 2013-41170 A, a rotating wheel (a so-called color wheel) is used to time-divisionally emit a red light emitted from a light emitting element, a blue light emitted from an excitation light source, and a green light emitted from a phosphor upon excited by an excitation light (blue light) emitted from the excitation light source. In this case, only the red light emitted from the light emitting element is used for emitting a red light, which may result in a low luminous efficiency and a failure in obtaining a standard color tone. Emission can be increased by increasing the number of light emitting elements. However, the number of light emitting elements that can be mounted on a small projector is limited. As a result, high emission cannot be obtained.

The present invention has been made to solve the above problems, and an object thereof is to provide a high-emission light source device which is capable of obtaining a desired color tone of red light and can be mounted on a small projector.

A light source device according to one aspect of the present invention is provided with a first light source for emitting a red light, a second light source for emitting a light different from the red light, a fluorescent member for emitting a light containing a red light component and a light component other than the red light component upon being excited by the light emitted from the second light source, and a filter for transmitting or reflecting the red light component of the light emitted from the fluorescent member. The light from the first light source and the red light component of the light from the fluorescent member are combined.

The present invention makes it possible to provide a high-emission light source device which is capable of obtaining a desired color tone of red light and can be mounted on a small projector.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Hereinbelow, embodiments of a light source device and a projector provided with the light source device according to the present invention will be described with reference to the drawings. The embodiments described below are examples for embodying a technical idea of the present invention, and the present invention is thus not limited to the following embodiments. The position or the size of each member shown in each of the drawings may be exaggerated for clear description. As a general rule, identical names or identical reference marks designate identical elements or equivalent elements, and description thereof will be omitted.

Figure 1:
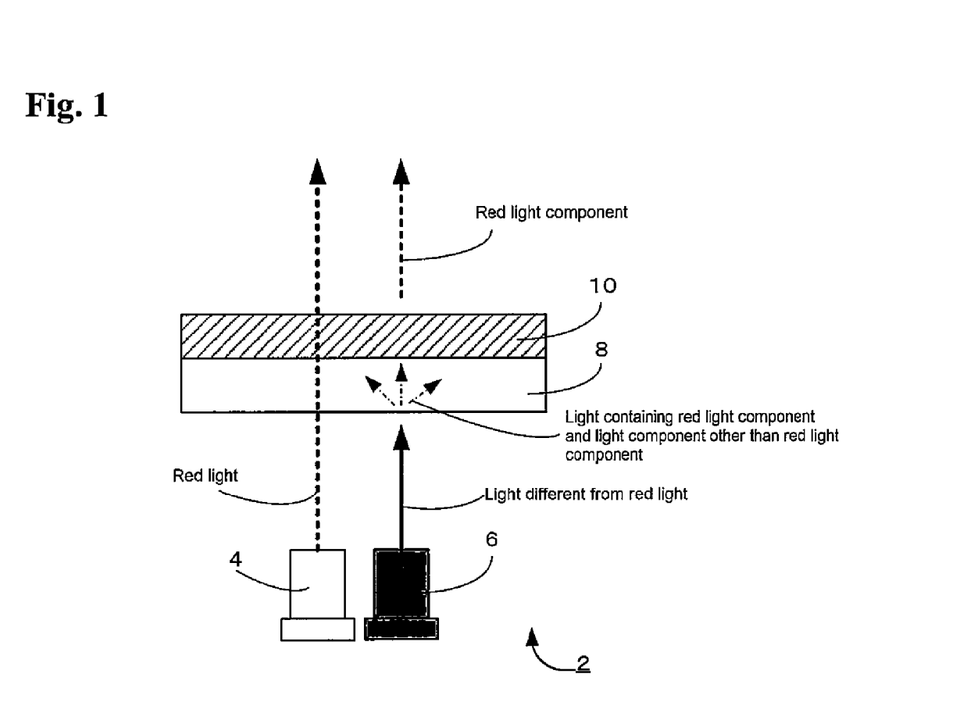
FIG. 1 is a diagram schematically illustrating an embodiment of a light source device according to the present invention.

FIG. 1 is a diagram schematically illustrating an embodiment of the light source device according to the present invention. As shown in FIG. 1, a light source device 2 of the present embodiment is provided with a first light source 4 for emitting a red light, a second light source 6 for emitting a light different from the red light, a fluorescent member 8 for emitting a light containing a red light component and a light component other than the red light component upon being excited by an excitation light emitted from the second light source 6, and a filter 10 for transmitting or reflecting the red light component of the light emitted from the fluorescent member 8.

In the present specification, the term "red light" emitted from the first light source 4 refers to light in a red wavelength range (620 nm to 750 nm). The term "light different from the red light" emitted from the second light source 6 refers to light of any wavelength range other than the red wavelength range, and is not limited to visible light. The term "red light component" refers to, for example, light having a chromaticity x =0.56 (corresponding to a wavelength of 587 nm) or greater. That is, the "red light component" refers to light that may have a shorter wavelength than the red wavelength range (e.g., light in a yellow wavelength range). Further, the term "light contacting a red light component and a light component other than the red light component" emitted from a fluorescent member refers to light in a wide wavelength range. Example of the "light contacting a red light component and a light component other than the red light component" may be the light which mainly contains light in a yellow wavelength range (mainly light of a wavelength of 570 nm or greater) and light which mainly contains light in a green wavelength range (mainly light of a wavelength of 495 nm or greater).

Semiconductor laser elements (LD) may be used as the first light source 4 and the second light source 6. This makes it possible to obtain a small and high-emission light source at a low cost. Each of the light sources 4, 6 is not limited to a semiconductor laser element. Any light emitting elements such as a light emitting diode element (LED) may be used as long as light can be introduced in an optical system.

Figure 4A:
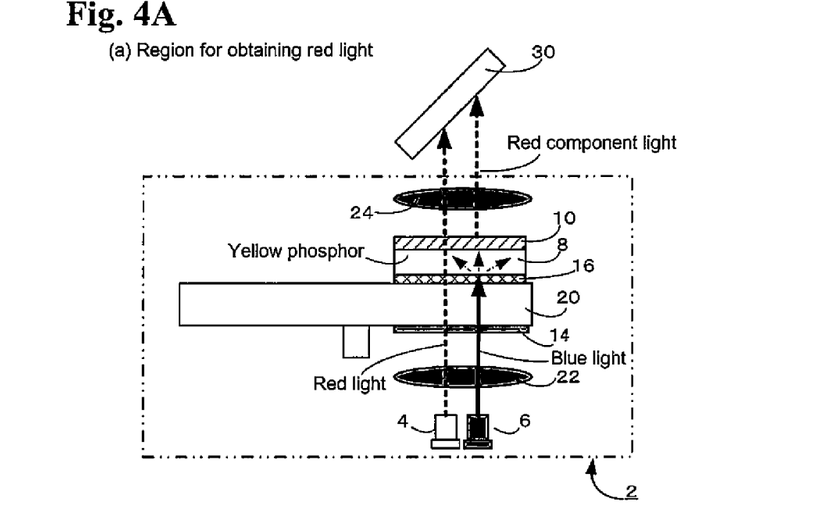
FIGS. 4A to 4C are schematic diagrams showing an embodiment of a light source device provided with the wheel shown in FIG. 3.
Figure 4B:
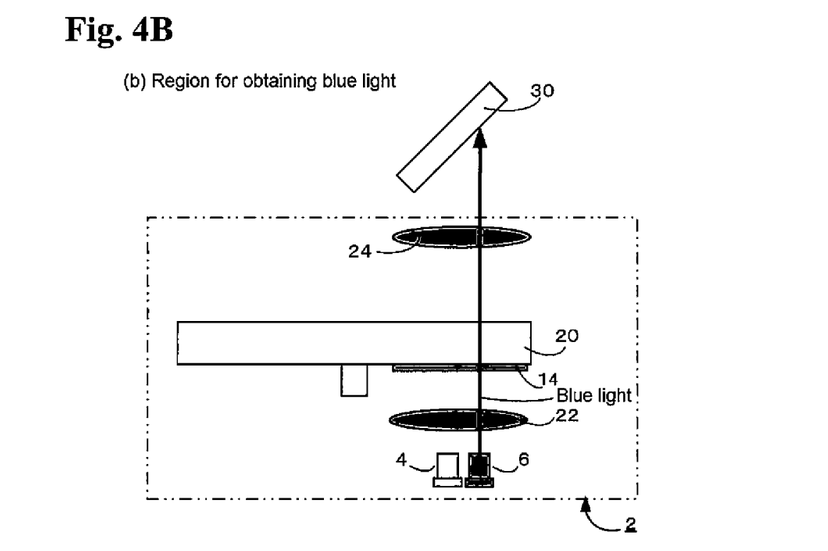
Figure 4C:
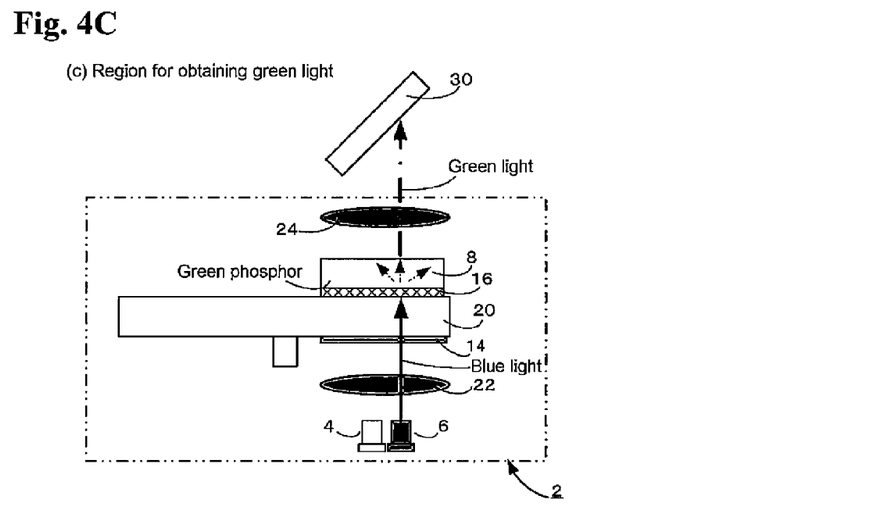

In the present embodiment, light emitted from the second light source 6 enters the fluorescent member 8, and light containing a red light component and a light component other than the red light component is emitted from the fluorescent member 8. Then, the light emitted from the fluorescent member 8 enters the filter 10. At this point, of the light emitted from the fluorescent member 8, mainly the red light component passes through the filter 10 and light of other wavelength ranges is reflected by the filter 10. Meanwhile, the red light emitted from the first light source 4 passes through the fluorescent member 8 without being subjected to wavelength conversion, and further passes through the filter 10. Accordingly, a combined light of the red light emitted from the first light source 4 and the red light component based on the light emitted from the second light source 6 can be emitted from the filter 10. In FIG. 1, the light emitted from the first light source 4 and the light emitted from the second light source 6 are shown as travelling in parallel lines with a predetermined distance therebetween. But in an actual state, as shown in FIGS. 4A to 4C, the light emitted from the first light source 4 and the light emitted from the second light source 6 are collected by an optical system, and collimated combined light is emitted. In the embodiment shown in FIG. 1 of the light emitted from the fluorescent member 8, the red light component is extracted by the filter 10 which is configured to transmit the red light component therethrough, but it is not limited thereto. The red light component can be extracted by a filter 10 which is configured to reflect the red light component of the light emitted from the fluorescent member 8. This configuration will be descried below with reference to FIGS. 2A to 2D.

In the present embodiment, the above configuration makes it possible to obtain a desired color tone of red light by combining the red light emitted from the first light source 4 and the red light component based on the light emitted from the second light source 6, and to achieve the high-emission light source device 2. Further, the light source device 2 is not required to include a large number of first light sources 4 which are configured to emit red light, and thus can be mounted on a small projector. Further, with the first light source 4 and the second light source 6 arranged inside a single unit, the emission from the light sources can share a common optical path. Accordingly, the number of components can be reduced and space saving can be achieved.

Various embodiments of the arrangement of the second light source 6, the fluorescent member 8, and the filter 10 may be employed. More specifically, the filter 10 may be arranged at a side of the fluorescent member 8 where light emitted from the second light source 6 enters, or may be arranged at a side of the fluorescent member 8 which is opposite to the side where light emitted from the second light source 6 enters. Further, the fluorescent member 8 and the filter 10 may be arranged to be adjacent to each other or may be arranged spaced apart from each other. Further, the filter 10 may transmit a red light component (light having a wavelength to be extracted) therethrough or may reflect a red light component (light having a wavelength to be extracted). Combinations of the above configurations give rise to eight patterns (2×2×2 =8), of which four typical patterns will be described below with reference to FIGS. 2A to 2D.

Figure 2A:
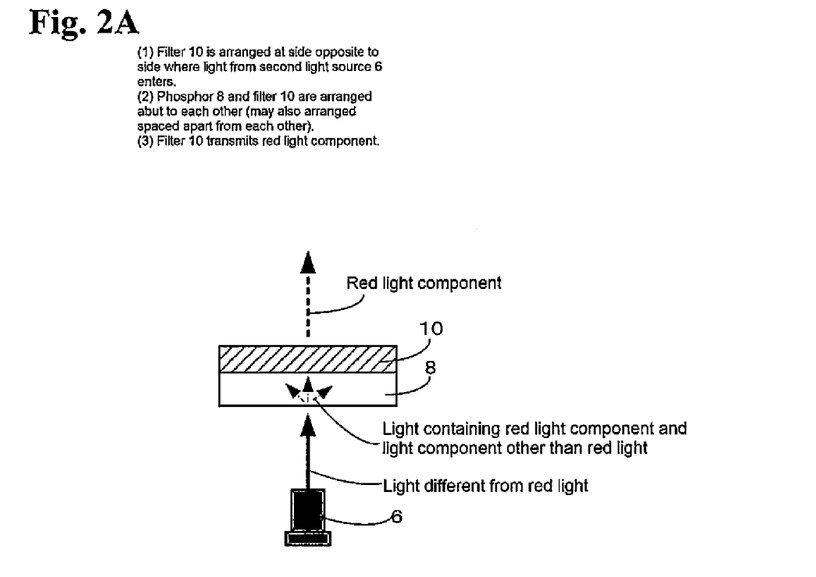
FIGS. 2A to 2D are schematic diagrams showing various embodiments of the light source device according to the present invention.

FIG. 2A shows a configuration in which the filter 10 is arranged at a side of the fluorescent member 8 which is opposite to the side where light emitted from the second light source 6 enters, the fluorescent member 8 and the filter 10 are arranged to be adjacent to each other, and the filter 10 transmits a red light component (light having a wavelength to be extracted) therethrough. That is, the embodiment shown in FIG. 2A has an arrangement similar to that of the embodiment shown in FIG. 1. Light emitted from the second light source 6 enters the fluorescent member 8 and light which contains a red light component and a light component other than the red light component is emitted from the fluorescent member 8. The light emitted from the fluorescent member 8 enters the filter 10 which is disposed to be adjacent to the fluorescent member 8 at the side opposite to the side where light emitted from the second light source 6 enters. At this point, of the light emitted from the fluorescent member 8, mainly the red light component passes thorough the filter 10 and the light of other wavelength range is reflected by the filter 10. Accordingly, the red light component is emitted from the filter 10 (light source device 2).

Since the filter 10 is arranged at a side of the fluorescent member 8 which is opposite to the side where light emitted from the second light source 6 enters, the light emitted from the fluorescent member 8 is allowed to enter the filter 10 without passing through a reflective member or the like. Thus, the red light component can be efficiently emitted. Further, since the filter 10 is arranged to be adjacent to the fluorescent member 8, the light emitted from the fluorescent member 8 is allowed to directly enter the filter 10. Thus, the efficiency can be further increased. Since the fluorescent member 8 and the filter 10 are arranged adjacently to each other, no optical system is arranged between the fluorescent member 8 and the filter 10. Thus, the light source device 2 can be downsized. The filter 10 transmits red light component. Thus, red light component can be easily extracted.

In an embodiment shown in FIG. 2A, the fluorescent member 8 and the filter 10 which is configured to transmit a red light component are arranged to be adjacent to each other, but it is not limited thereto, the fluorescent member 8 and the filter 10 for transmitting the red light component may be arranged spaced apart from each other. In this case, the filter 10 is arranged spaced apart from the fluorescent member 8, so that the filter 10 is not affected by heat generated in the fluorescent member 8. Thus, degradation of the filter 10 does not easily occur. Further, the configuration allows arrangement of an optical system (e.g., lens) between the fluorescent member 8 and the filter 10. With the optical system (e.g., lens), the angle of light incident in the filter 10 from the fluorescent member 8 can be adjusted, and thus, the accuracy of characteristics of the filter 10 can be improved. Further, the fluorescent member 8 and the filter 10 may be connected via another member. Also in this case, the light source device 2 can be miniaturized. An example of such a member includes a transparent member having a heat insulating property. Interposing such a member between the fluorescent member 8 and the filter 10 makes it possible to prevent the filter 10 from being deteriorated by heat generated in the fluorescent member 8. Also in the case where the filter 10 is arranged at the side of the fluorescent member 8 where the light emitted from the second light source 6 enters, in a similar manner as in above, a configuration of the fluorescent member 8 and the filter 10 connected via another member can be achieved.

Figure 2B:
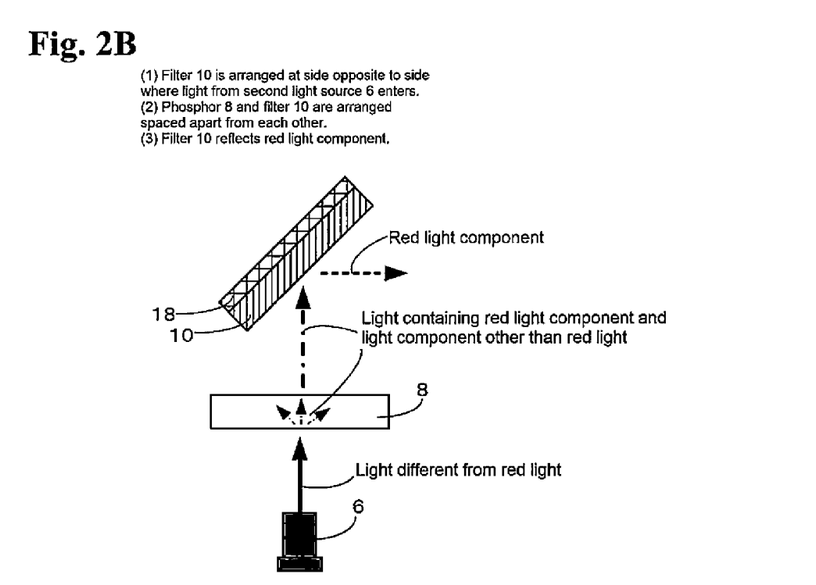

FIG. 2B shows a case in which the filter 10 is disposed to the fluorescent member 8 at the side opposite to the side where light emitted from the second light source 6 enters, the fluorescent member 8 and the filter 10 are arranged separately from each other, and the filter 10 reflects red light component (light having a wavelength to be extracted). In such a configuration, light emitted from the second light source 6 enters the fluorescent member 8, and light containing a red light component and a light component other than the red light component is emitted from the fluorescent member 8. The light emitted from the fluorescent member 8 travels opposite to the side where light emitted from the second light source 6 enters in the fluorescent member 8, and enters the filter 10 which is arranged separately from the fluorescent member 8. At this point, the red light component is mainly reflected by the filter 10 and light in the other wavelength range passes through the filter 10 among the light emitted from the fluorescent member 8. The light in the other wavelength range that has passed through the filter 10 is absorbed by an absorption film 18. Accordingly, the red light component is emitted from the filter 10.

Since the filter 10 is arranged separately from the fluorescent member 8, the filter 10 is not affected by heat generated in the fluorescent member 8. Thus, the filter 10 is not likely to be deteriorated. Further, an optical system (e.g., lens) may be arranged between the fluorescent member 8 and the filter 10. This enables the optical system (e.g., lens) to adjust the angle of light which enters the filter 10 from the fluorescent member 8. Thus, the accuracy of characteristics of the filter 10 can be improved.

Figure 2C:
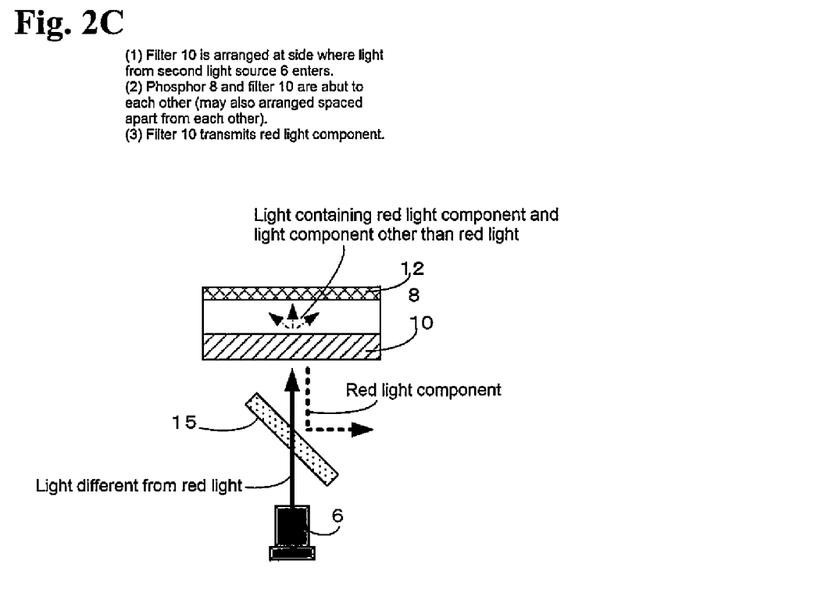

FIG. 2C shows a case in which the filter 10 is disposed to the fluorescent member 8 at the side where light emitted from the second light source 6 enters, the fluorescent member 8 and the filter 10 are arranged adjacently to each other, and the filter 10 transmits red light component (light having a wavelength to be extracted). In this case, a dichroic mirror 15 is disposed between the second light source 6 and the filter 10. The dichroic mirror 15 reflects red light component and transmits light in the other wavelength range. Further, a reflective film 12 is disposed to the fluorescent member 8 at the side opposite to the side where light emitted from the second light source 6 enters.

In such a configuration, light emitted from the second light source 6 first enters and passes through the dichroic mirror 15, and then enters and passes through the filter 10. In the present embodiment, the filter 10 which transmits blue light and red light component and reflects light in the other wavelength range is used. The light emitted from the filter 10 enters the fluorescent member 8, and light containing a red light component and a light component other than the red light component is emitted from the fluorescent member 8. Then, the light emitted from the fluorescent member 8 is reflected by the reflective film 12 and thereby turned around by 180 degrees, then passes through the fluorescent member 8, and then enters the filter 10. At this point, the red light component mainly passes through the filter 10 and light in the other wavelength range (blue light has been wavelength-converted by the phosphor) is reflected by the filter 10 among the light emitted from the fluorescent member 8. The red light component emitted from the filter 10 further travels, is then reflected by the dichroic mirror 15 and thereby turned around by 90 degrees, and then emitted. The fluorescent member 8 and the filter 10 are arranged adjacent to each other in the present embodiment, but it is not limited thereto, the fluorescent member 8 and the filter 10 may be arranged spaced apart from each other.

In such a configuration, the red light component is emitted to the side where light emitted from the second light source 6 enters in the fluorescent member 8. Thus, it is possible to achieve a projector in which the members are arranged in a compact manner.

Figure 2D:
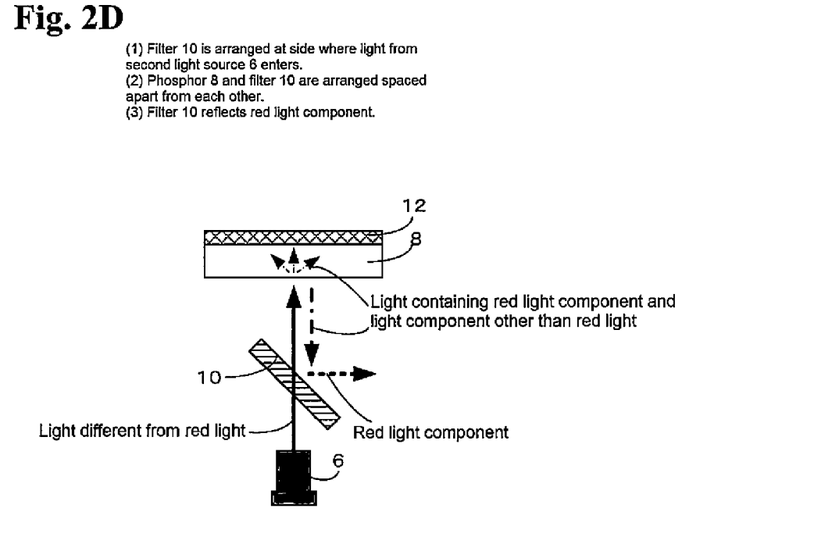

FIG. 2D shows a configuration in which the filter 10 is arranged at a side of the fluorescent member 8 where the light emitted from the second light source 6 enters, the fluorescent member 8 and the filter 10 are arranged spaced apart from each other, and the filter 10 is configured to reflect the red light component (light of a wavelength to be extracted). In this case, a reflective film 12 is arranged at a side of the fluorescent member 8 which is opposite to the side where light emitted from the second light source 6 enters.

In such a configuration, light emitted from the second light source 6 enters and passes through the filter 10 which is configured to reflect the red light component and to transmit light of other wavelength ranges. The light further travels and enters the fluorescent member 8, and light containing a red light component and a light component other than the red light component is emitted from the fluorescent member 8. Then, the light emitted from the fluorescent member 8 is reflected by the reflective film 12 and turned around by 180 degrees, then passes through the fluorescent member 8, and emitted toward the second light source 6. The emitted light further travels and enters the filter 10. At this point, of the light emitted from the fluorescent member 8, mainly the red light component is reflected by the filter 10 and is turned around by 90 degrees, and the red light component is emitted from the filter 10. Meanwhile, the light of other wavelength range passes through the filter 10.

In such a configuration, the red light component is emitted to the side where light emitted from the second light source 6 enters the fluorescent member 8. Thus, it is possible to realize a projector in which the members are arranged in a compact manner. Further, the light source device 2 is provided with a small number of components, so that it is also possible to achieve miniaturization of the light source device.

In FIGS. 1 and 2A to 2D, a region where the light emitted from the second light source 6 enters (a region where the fluorescent member 8 and the filter 10 are disposed) is fixed. However, the region where light emitted from the second light source 6 enters may be arranged on a movable member in which the region where light emitted from the second light source 6 enters changes with time. In this case, the movable member includes a region in which a fluorescent member is arranged. The movable member may further include a region in which a plurality of fluorescent members emitting different colors of light are arranged or a region through which the light emitted from the light sources 4, 6 is allowed to transmit through without being wavelength-converted. Examples of the movable member include a wheel which performs a rotary motion and a shutter which performs a translational motion or a reciprocating motion. The case in which a wheel is used as the movable member will be described below with reference to FIGS. 3 and 4A to 4C. When a shutter is used as the movable member, a shutter which mechanically controls reflection/transmission of light may be used. For example, the shutter may be allowed to slide or reciprocate in a horizontal direction in FIG. 1.

The above configuration makes it possible to achieve a light source device which emits, for example, blue light component, green light component, and red light component in a time division manner.

Figure 3:
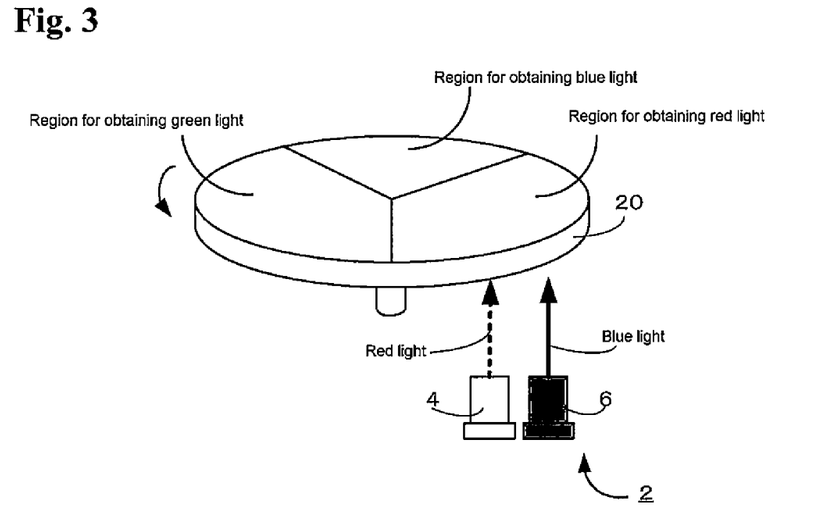
FIG. 3 is a perspective view showing an embodiment of a wheel used in the light source device according to the present invention.

Next, a light source device 2 which is provided with a wheel 20 and capable of emitting light of a plurality of color components in a time division manner will be described in detail with reference to FIGS. 3 and 4A to 4C. FIG. 3 is a perspective view showing an embodiment of the wheel used in the light source device according to the present invention. As with the case shown in FIG. 2A, in the embodiment shown in FIGS. 3 and 4A to 4C, the filter 10 is arranged at a side of the fluorescent member 8 which is opposite to the side where light emitted from the first light source 4 and the second light source 6 enters, the fluorescent member 8 and the filter 10 are arranged be adjacent to each other, and the filter 10 is configured to transmit a red light component (light having a wavelength to be extracted). A red light is emitted from the first light source 4 and a blue light is emitted from the second light source as a light different from the red light. The wheel 20 includes a region for emitting a red light, a region for emitting a blue light, and a region for emitting a green light upon receiving the light emitted from the light sources. When the wheel 20 rotates, the region for emitting a red light, the region for emitting a blue light, and the region for emitting a green light sequentially cross respective optical paths of the light emitted from the light sources 4, 6. Therefore, it is possible to emit a red light, a blue light, and a green light in a time division manner.

Next, the light source device 2 will be described in more detail with reference to FIGS. 4A to 4C which are schematic views of the wheel 20 of FIG. 3 viewed in the lateral direction. FIG. 4A shows a state in which the region in which a red light is obtained in the wheel 20 crosses the optical path of light emitted from the light sources 4, 6. FIG. 4B shows a state in which the region in which blue light is obtained in the wheel 20 crosses the optical path of light emitted from the light sources 4, 6. FIG. 4C shows a state in which the region in which green light is obtained in the wheel 20 crosses the optical path of light emitted from the light sources 4, 6. In any of the cases, the light source device 2 is provided with the first light source 4 which emits red light, the second light source 6 which emits blue light, the wheel 20, an optical system (e.g., a condenser lens) 22 which is arranged on an optical path between the light sources 4, 6 and the wheel 20, and an optical system (e.g., a condenser lens) 24 which is arranged at the emission side of the wheel 20. An example of the first light source 4 which is configured to emit a red light includes a red semiconductor laser element (LD) having a peak wavelength of 640 nm. An example of the second light source 6 which is configured to emit a blue light includes a blue semiconductor laser element (LD) having a peak wavelength of 445 nm. However, the light sources are not limited to these light sources, and any light sources other than the above may be used. An example of the wheel 20 includes a transparent glass. A transparent resin material having a sufficient transmittance and heat resistance can also be used. In this case, the weight of the wheel 20 can be reduced. A projecting element 30 which sequentially modulates light having a plurality of wavelengths emitted from the light source device 2 to form an image is arranged at the emission side of the light source device 2. The projecting element 30 will be described below with reference to FIG. 8.

First, in the case of FIG. 4A, it is described that the region in which red light is obtained crosses the optical path of light emitted from the light sources 4, 6. In FIG. 4A, a band-pass filter (phosphor light reflecting filter) 16, a fluorescent member 8, and a filter 10 are disposed be adjacent to one another to the wheel 20 in this order from the wheel 20 (that is, in the light traveling direction) at the side opposite to the side where light emitted from the light sources 4, 6 enters. Meanwhile, an antireflective film 14 is disposed to the wheel 20 at the side where light emitted from the light sources 4, 6 enters. The fluorescent member 8 may be arranged at either the incident side or the emission side (opposite to the incident side) of light emitted from the light sources 4, 6 in the wheel 20. However, the fluorescent member 8 is preferably disposed at the light emission side as shown in FIG. 4A. Accordingly, the optical system 24 and the fluorescent member 8 are arranged close to each other. Thus, it is possible to efficiently guide the light emitted from the fluorescent member 8 into the optical system 24.

The fluorescent member 8 includes a yellow phosphor for emitting yellow light upon irradiated by a blue light as an excitation light. More specifically, an example of the phosphor includes $Y_3Al_5O_{12}$:Ce. In this case, light in a wavelength range of approximately 550 nm is emitted. The band-pass filter (phosphor light reflecting filter) 16 is configured to reflect a yellow light component emitted from the phosphor of the fluorescent member 8 and transmits light of other wavelength ranges. Also, the antireflective film 14 is configured to prevent the light emitted from the first light source 4 and the second light source 6 from being reflected and to allow a larger amount of light to pass through the wheel 20. More specifically, an example of the antireflective film 14 includes a dielectric multilayer film such as a multilayer film of $SiO_2$ and $Nb_2O_5$.

At the timing when the region in which red light is obtained crosses the optical path of light emitted from the light sources 4, 6, the first light source 4 and the second light source 6 are simultaneously in an ON-state. The red light emitted from the first light source 4 is substantially collected by the optical system 22, then reaches the entrance side of the wheel 20, then passes through the antireflective film 14, the wheel 20, the band-pass filter (phosphor light reflecting filter) 16, the fluorescent member 8 and the filter 10, and is then emitted to the side opposite to the light sources 4, 6. Then, the emitted light enters the optical system 24, is then substantially collected by the optical system 24, and then enters the projecting element 30. That is, the red light emitted from the first light source 4 is emitted as it is after passing through each of the members without being wavelength-converted. It is also possible to guide the red light emitted from the first light source 4 to enter the projecting element 30 without passing through the wheel 20 by the arrangement of the first light source 4 or the optical system.

On the other hand, blue right emitted from the second light source 6 is substantially collected by the optical system 22, then reaches the entrance side of the wheel 20, then passes through the antireflective film 14, the wheel 20 and the band-pass filter (phosphor light reflecting filter) 16, and then enters the fluorescent member 8. The phosphor included in the fluorescent member 8 emits yellow light by being excited by blue light. Since the phosphor is dispersed inside the fluorescent member 8, yellow light is dispersedly emitted. However, since yellow light toward the second light source 6 is reflected by the band-pass filter (phosphor light reflecting filter) 16, most of the yellow light travels toward the filter 10 and enters the filter 10. Red light component mainly passes through the filter 10 and light in the other wavelength range is reflected by the filter 10 among the yellow light. Accordingly, the red light component is mainly emitted from the filter 10, then substantially collected by the optical system 24, and then enters the projecting element 30. In this manner, the red light component based on the light emitted from the second light source 6 and the red light emitted from the first light source 4 are combined and emitted. Thus, it is possible to obtain a desired color tone of red light by combining the red light emitted from the first light source 4 and the red light component based on light emitted from the second light source 6. Thus, it is possible to achieve the high-emission light source device 2. Further, the light source device 2 is not required to have a large number of first light sources 4 which emit red light, and thus can be mounted on a small projector.

In the present embodiment, the fluorescent member 8 includes the yellow phosphor which emits yellow light when blue light enters the yellow phosphor as excitation light, but it is not limited thereto. The fluorescent member 8 may include a green phosphor which emits green light when blue light enters the green phosphor as excitation light. More specifically, an example of the phosphor includes $Lu_3Al_5O_{12}$:Ce. In this case, light in a wavelength range of approximately 520 nm is emitted. Further, the fluorescent member 8 may include both the yellow phosphor which emits yellow light when blue light enters the yellow phosphor as excitation light and the green phosphor which emits green light when blue light enters the green phosphor as excitation light. Also in this case, red light component can be extracted by the filter 10. Thus, as with the case in which only the yellow phosphor is included, it is possible to obtain a desired color tone of red light by combining red light emitted from the first light source 4 and red light component based on light emitted from the second light source 6. Thus, it is possible to achieve the high-emission light source device 2. When the yellow phosphor is included, a larger amount of red light component can be extracted than when the green phosphor is included. Thus, higher emission can be achieved.

Next, in the case of FIG. 4B, it is described that the region in which blue light is obtained crosses the optical path of light emitted from the light source 6. In FIG. 4B, the antireflective film 14 is disposed to the wheel 20 at the side where light emitted from the light source 6 enters. The antireflective film 14 prevents reflection of light emitted from the second light source 6 to allow a larger amount of light to pass through the wheel 20. No member is disposed to the wheel 20 at the side opposite to the side where light emitted from the second light source 6 enters.

At the timing when the region in which blue light is obtained crosses the optical path of light emitted from the light source 6, the first light source 4 is in an OFF-state, and only the second light source 6 is an ON-state. Blue light emitted from the second light source 6 is substantially collected by the optical system 22, then reaches the entrance side of the wheel 20, then passes through the antireflective film 14 and the wheel 20, and is then emitted to the side opposite to the second light source 6. Then, the blue light is substantially collected by the optical system 24 and enters projecting element 30. That is, the blue light emitted from the second light source 6 is emitted as it is without being wavelength-converted.

Next, in the case of FIG. 4C, it is described that the region in which green light is obtained crosses the optical path of light emitted from the second light source 6. In FIG. 4C, the band-pass filter (phosphor light reflecting filter) 16 and the fluorescent member 8 are adjacently disposed to the wheel 20 in this order from the wheel 20 (that is, in the light traveling direction) at the side opposite to the side where light emitted from the light source 6 enters. On the other hand, the antireflective film 14 is disposed to the wheel 20 at the side where light emitted from the second light source 6 enters.

The fluorescent member 8 includes a green phosphor which emits green light when blue light enters the green phosphor as excitation light. The band-pass filter (phosphor light reflecting filter) 16 reflects green light component emitted from the phosphor of the fluorescent member 8 and transmits light in the other wavelength range. The antireflective film 14 prevents reflection of light emitted from the second light source 6 to allow a larger amount of light to pass through the wheel 20. Although, in the embodiment shown in FIGS. 4A to 4C, the antireflective film 14 is arranged at the entrance side of light emitted from the light sources 4, 6 in the wheel 20, the present invention is not limited thereto. The antireflective film 14 may be arranged at the light emission side (the side opposite to the light entrance side). In this case, the antireflective film 14 is preferably arranged at a position closest to the wheel 20. For example, in the cases shown in FIGS. 4A and 4C, the antireflective film 14 is preferably arranged between the wheel 20 and the band-pass filter (phosphor light reflecting filter) 16.

At the timing when the region in which green light is obtained crosses the optical path of light emitted from the second light source 6, the first light source 4 is in an OFF-state, and only the second light source 6 is in an ON-state. Blue light emitted from the second light source 6 is substantially collected by the optical system 22, then reaches the entrance side of the wheel 20, then passes through the antireflective film 14, the wheel 20 and the band-pass filter (phosphor light reflecting filter) 16, and then enters the fluorescent member 8. The phosphor included in the fluorescent member 8 emits green light by being excited by blue light. Since the phosphor is dispersed inside the fluorescent member 8, the green light is dispersedly emitted. However, since green light toward the second light source 6 is reflected by the band-pass filter (phosphor light reflecting filter) 16, most of the green light is emitted from the wheel 20. The emitted green light is substantially collected by the optical system 24 and enters the projecting element 30. As described above, the light source device 2 shown in FIGS. 3 and 4A to 4C emits red light, blue light, and green light in a time division manner and allows the light to enter the projecting element 30. Accordingly, it is possible to achieve a time division type color projector. Although, in the embodiments shown in FIGS. 4B and 4C, the first light source 4 is in an OFF-state, the present invention is not limited thereto. The first light source 4 may be constantly in an ON-state. In this case, a reflective film configured to reflect a red light may be disposed on the wheel 20 at the side where light emitted from the light source 4 enters in the region to emit a blue light and the region to emit a green light. Thus, unnecessary emission of red light can be prevented even with the first light source 4 being an ON-state. In the above embodiment, the single first light source 4 and the single second light source 6 are provided. However, a plurality of first light sources 4 and a plurality of second light sources 6 may be provided if there is an enough space.

Figure 5:
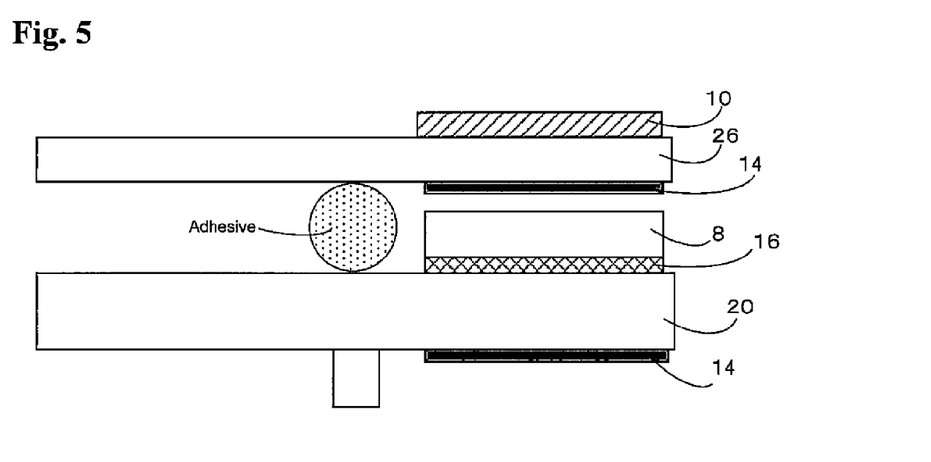
FIG. 5 is a schematic diagram showing a more detailed configuration of an embodiment of the wheel used in the light source device according to the present invention.

Next, a more detailed structure of the embodiment of the wheel 20 will be described with reference to FIG. 5. FIG. 5 shows the structure of the region in which red light is obtained in FIG. 4A. The present embodiment shows a structure in which the wheel 20 and a transparent substrate 26 are bonded to each other. The band-pass filter (phosphor light reflecting filter) 16 and the fluorescent member 8 are disposed to the wheel 20 in this order from the wheel 20 (that is, in the light traveling direction) at the side opposite to the side where light emitted from the light sources 4, 6 enters.

The antireflective film 14 is disposed to the wheel 20 at the side where light emitted from the light sources 4, 6 enters. On the other hand, the filter 10 is disposed to the transparent substrate 26 at the side opposite to the side where light emitted from the light sources 4, 6 enters. The antireflective film 14 is disposed to the transparent substrate 26 at the side where light emitted from the light sources 4, 6 enters. A surface of the wheel 20 on which the fluorescent member 8 is disposed and a surface of the transparent substrate 26 on which the antireflective film 14 is disposed are bonded to each other by an adhesive material. Accordingly, a configuration in which the antireflective film 14, the wheel 20, the band-pass filter (phosphor light reflecting filter) 16, the fluorescent member 8, the antireflective film 14, the transparent substrate 26, and the filter 10 are arranged in this order in the traveling direction of light emitted from the first light source 4 and the second light source 6 can be obtained.

Description of Example

Figure 6:
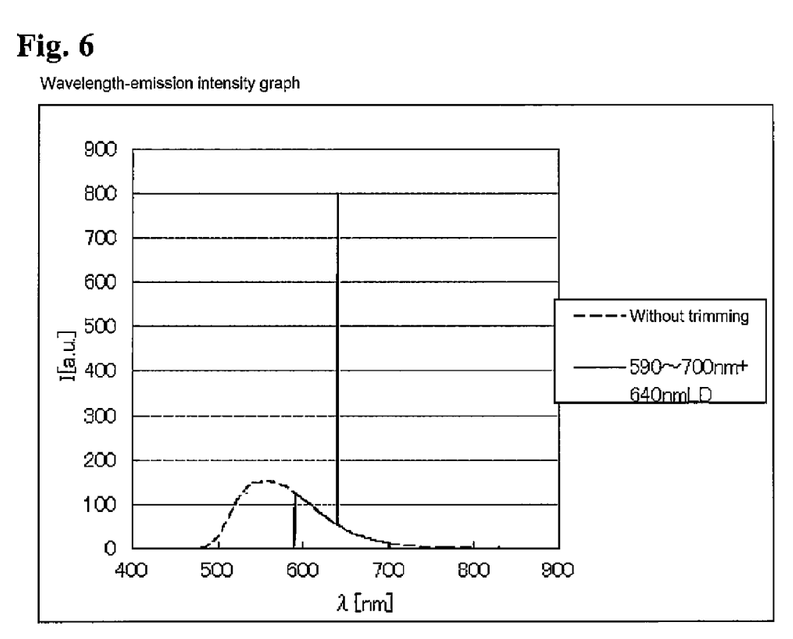
FIG. 6 is a diagram showing a relationship between the wavelength and the emission intensity of light emitted from a light source device according to an embodiment of the present invention.

In the light source device of the present invention having the configuration shown in FIGS. 1 to 5 as described above, the emission intensity in each wavelength was actually measured. FIG. 6 is a wavelength-emission intensity graph showing a result of the measurement. In the graph, the horizontal axis represents the wavelength (nm) and the vertical axis represents the emission intensity (a.u.). Blue light emitted from the second light source 6 which is a blue semiconductor laser element (LD) having a peak wavelength of 445 nm enters the fluorescent member 8 which includes a yellow phosphor ($Y_3Al_5O_{12}$:Ce), and yellow light indicated by a broken line in FIG. 6 is thereby emitted. Then, the filter 10 extracts red light component (light in a wavelength of 590 to 700 nm). The extracted red light component and red light emitted from the first light source 4 which is a red semiconductor laser element (LD) having a peak wavelength of 640 nm are combined, and high-emission red light indicated by a solid line in FIG. 6 is thereby obtained. The graph of FIG. 6 having a peak near 640 nm shows that the light source device of the present invention is capable of emitting high-emission red light.

Figure 7:
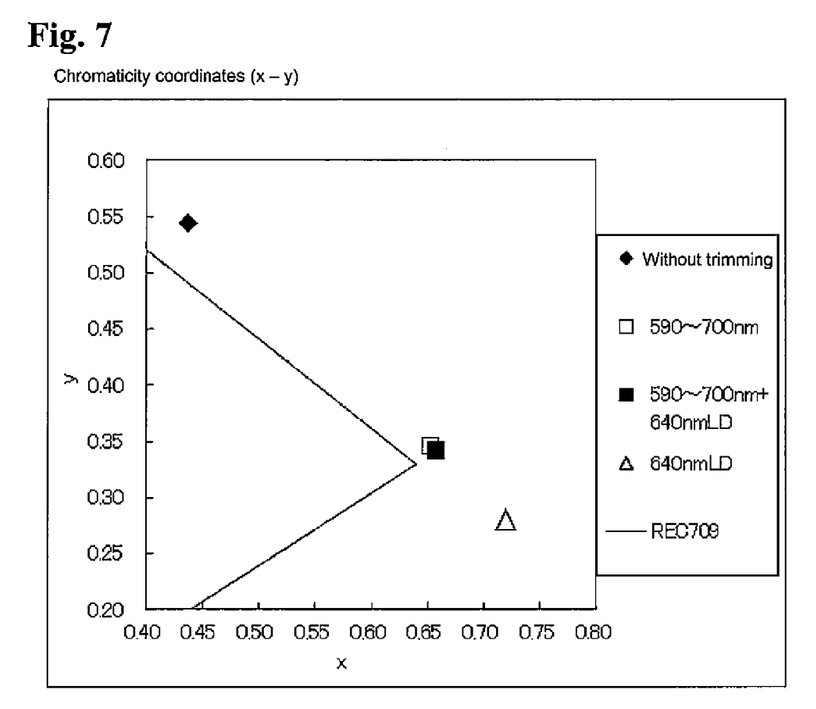
FIG. 7 is a diagram showing chromaticity coordinates of light emitted from the light source device according to an embodiment of the present invention.

On the other hand, chromaticity coordinates (x-y) of FIG. 7 show that a desired color tone of red light can be obtained. In FIG. 7, blue light emitted from the second light source 6 enters the fluorescent member 8 which includes the yellow phosphor ($Y_3Al_5O_{12}$:Ce), and yellow light is emitted. The chromaticity of the yellow light is indicated by a black diamond symbol described as "Without trimming". Then, light containing a red light component obtained by removing light in a wavelength range other than 590 to 700 nm is obtained from the yellow light by the filter 10. The chromaticity of the light containing the red light component is indicated by a white square symbol described as "590 to 700 nm". Red light emitted from the first light source 4 indicated by a plot of a white triangle described as "640 nm LD" is combined with the light containing the red light component. The chromaticity of the combined red light is indicated by a black square symbol described as "590 to 700 nm +640 nm LD". This is the chromaticity of the red light emitted from the light source device of the present invention. This reveals that red color having an excellent color tone (that is, a desired color tone of red light) can be obtained. The red color having an excellent color tone means that the color is close to a standard of REC709 (a color gamut of universal standard specification of HD video).

Description of Projector of Present Invention

Figure 8:
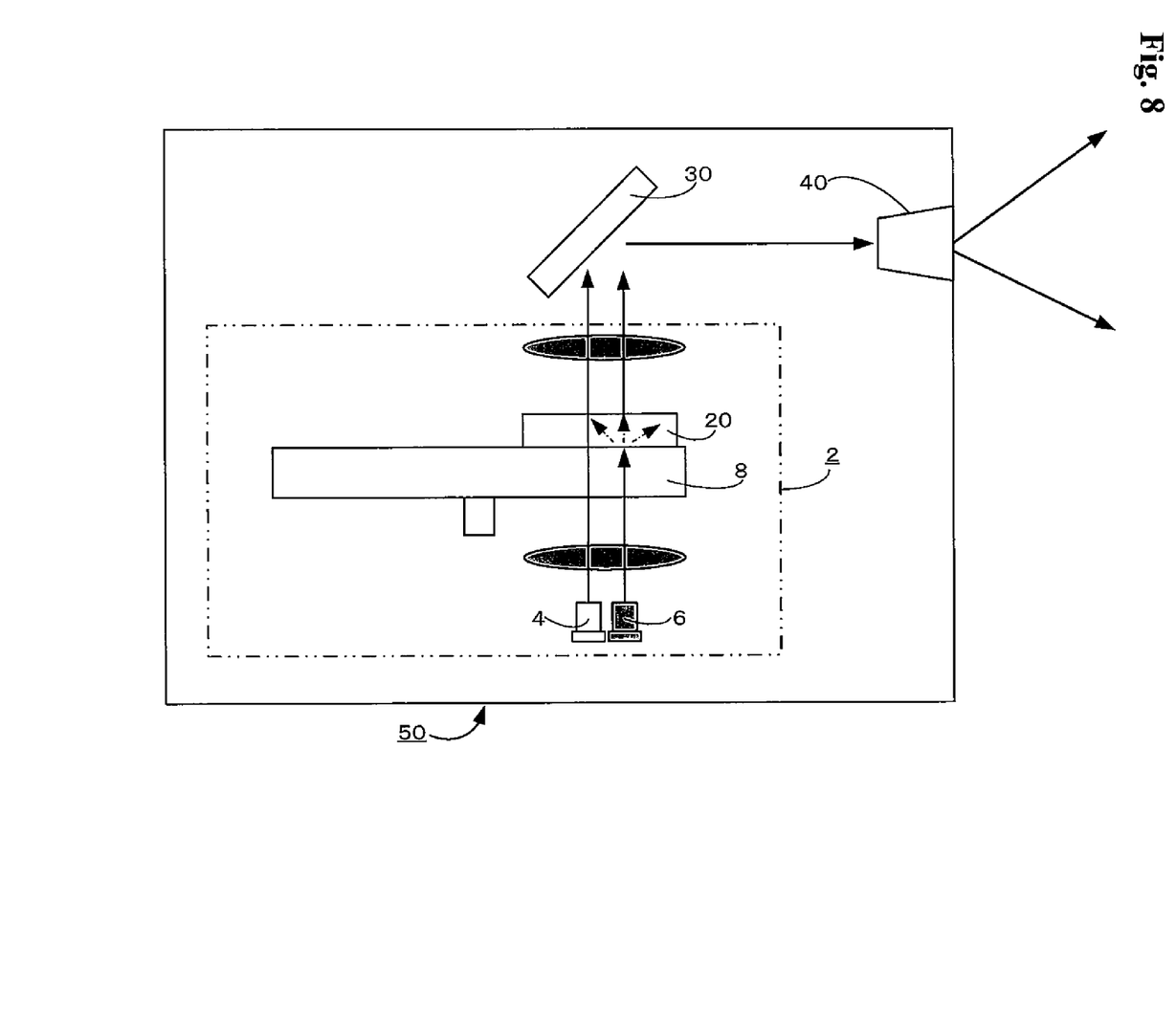
FIG. 8 is a diagram schematically illustrating an embodiment of a projector according to the present invention.

Next, an embodiment of a projector of the present invention will be described with reference to FIG. 8. In the present embodiment, a projector 50 is provided with the light source device 2 of the present invention, a projecting element 30 which sequentially modulates light having a plurality of wavelengths emitted from the light source device 2 on the basis of image data to form an image, and a projector unit 40 which enlarges and projects the image. The light source device 2 of any of the above embodiments may be employed.

The projecting element 30 includes a light modulation element and a drive control circuit thereof. In the present embodiment, a digital micro-minor device (DMD) element may be used as the projecting element 30. The DMD element includes minute mirrors which correspond to the respective pixels and are arrayed in matrix and is capable of switching ON-state and OFF-state by changing the tilt of each of the mirrors. That is, when the mirrors are tilted so as to reflect light that has entered the DMD element to the projector unit 40, the DMD element is in an ON-state. On the other hand, when the mirrors are tilted so as not to reflect light that has entered the DMD to the projector unit 40, the DMD element is in an OFF-state. Further, the gradation of light that enters the projector unit 40 can be changed depending on the ratio between an ON-state time and an OFF-state time. Thus, gradation display based on image data can be performed. The DMD element can be switched between ON-state and OFF-state in microseconds. Although the DMD element is used as the constituent element of the projecting element 30, the present invention is not limited thereto. Any other light modulation elements may be used depending on the intended use.

The projector unit 40 mainly includes a projector lens and is capable of enlarging an image formed by sequential modulation in the projecting element 30 to a predetermined size to project the image. As described above, in the present embodiment, it is possible to provide a high-emission and compact projector capable of obtaining a desired color tone of red light at a low manufacturing cost.

Description of Another Embodiment of Projector of Present Invention

Although there has been described the case in which the light source device 2 of the present invention is used in the time-division type projector in the above, the present invention is not limited thereto. For example, the light source device 2 of the present invention may be used as a color light source in a liquid crystal display device or a liquid crystal type projector. In this case, the light source device 2 simultaneously emits red light, blue light, and green light to positions corresponding to the respective pixels. Thus, the liquid crystal display device is not required to include, for example, a color filter. Also in this case, it is possible to obtain a desired color tone of red light and achieve a high-emission display device or a high-emission projector.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light source device comprising:
   a first light source for emitting a red light;
   a second light source for emitting a light different from the red light;
   a fluorescent member for emitting a light containing a red light component and a light component other than the red light component upon irradiated with the light emitted from the second light source; and
   a filter for transmitting or reflecting the red light component of the light emitted from the fluorescent member,
   wherein the light from the first light source and the red light component of the light from the fluorescent member are combined.

2. The light source device according to claim 1, wherein the second light source is a light source for emitting a blue light, and the fluorescent member includes at least one selected from a yellow phosphor and a green phosphor.

3. The light source device according to claim 1, wherein the light from the first light source and the red light component are collimated by an optical system.

4. The light source device according to claim 1, wherein the red light component has a wavelength in a range of 590 nm to 700 nm.

5. The light source device according to claim 1, wherein light from the first light source passes through the filter.

6. The light source device according to claim 1, wherein the first light source and the second light source are arranged in a single unit.

7. The light source device according to claim 1, wherein the filter is arranged at a side of the fluorescent member opposite to a side where light emitted from the second light source enters.

8. The light source device according to claim 7, wherein the filter is arranged be adjacent to the fluorescent member.

9. The light source device according to claim 7, wherein the filter is arranged spaced apart from the fluorescent member.

10. The light source device according to claim 8, wherein the filter allows the red light component to transmit therethrough.

11. The light source device according to claim 9, wherein the filter allows the red light component to transmit therethrough.

12. The light source device according to claim 1, wherein the first light source and the second light source are semiconductor laser elements.

13. The light source device according to claim 1, further comprising a movable member in which a region where light emitted from the second light source enters changes with time,
   wherein the movable member includes a region in which the fluorescent member is arranged.

14. The light source device according to claim 13, wherein the movable member is a wheel configured to perform a rotary motion.

15. The light source device according to claim 14, wherein
   the second light source is a light source for emitting a blue light,
   the wheel comprises a region for emitting a red light, a region for emitting a green light, and a region for emitting a blue light, upon receiving light from the second light source,
   the fluorescent member and the filter are disposed in the region for emitting the red light, and
   light extracted from the region for emitting the red light is a combined light of a red light component from the fluorescent member and light from the first light source.

16. The light source device according to claim 15, wherein in the region for emitting a red light, the light from the first light source is allowed to transmit through the wheel, the fluorescent member, and the filter without being wavelength-converted.

17. The light source device according to claim 15, wherein the fluorescent material is arranged on the wheel at an opposite side from the incident side of the light from the second light source.

18. The light source device according to claim 15, wherein a fluorescent material member which contains a green fluorescent material is disposed in the region for emitting green light, and a green light is emitted from the fluorescent material member which contains the green fluorescent material upon receiving the light from the second light source.

19. The light source device according to claim 15, wherein the light extracted from the region for emitting the blue light is light from the second light source.

* * * * *